(12) United States Patent
Hsu

(10) Patent No.: US 7,843,278 B2
(45) Date of Patent: Nov. 30, 2010

(54) FREQUENCY JITTER GENERATION CIRCUIT

(75) Inventor: Te-Hsien Hsu, Hsinchu (TW)

(73) Assignee: Niko Semiconductor Co., Ltd., Taipei (TW)

( * ) Notice: Subject to any disclaimer, the term of this patent is extended or adjusted under 35 U.S.C. 154(b) by 133 days.

(21) Appl. No.: 12/232,123

(22) Filed: Sep. 11, 2008

(65) Prior Publication Data

US 2009/0302955 A1    Dec. 10, 2009

(30) Foreign Application Priority Data

Jun. 6, 2008    (TW)    ............................... 97121200 A

(51) Int. Cl.
*H03K 3/02* (2006.01)
*H03B 29/00* (2006.01)
(52) U.S. Cl. ..................... 331/78; 331/111; 331/178
(58) Field of Classification Search .............. 331/143, 331/111, 78, 177 R, 178, 185
See application file for complete search history.

(56) References Cited

U.S. PATENT DOCUMENTS

| 6,798,302 | B2 * | 9/2004 | Starr et al. | ..................... 331/78 |
| 7,504,897 | B2 * | 3/2009 | Chava et al. | ................. 331/78 |
| 2008/0157831 | A1 * | 7/2008 | Hsu | ............................ 327/132 |

\* cited by examiner

*Primary Examiner*—Robert Pascal
*Assistant Examiner*—Ryan Johnson
(74) *Attorney, Agent, or Firm*—Rosenberg, Klein & Lee

(57) ABSTRACT

A frequency jitter generation circuit having a voltage generator and an oscillator circuit is provided. The voltage generator receives an input voltage and converts the input voltage into an upper reference voltage output to the oscillator circuit. Voltage level of the upper reference voltage is varying. The oscillator circuit is coupled with the voltage generator. Voltage level of a reference voltage in the oscillator circuit is oscillated between the upper reference voltage and a lower reference voltage to generate a frequency signal with a jitter based on the variation of the upper reference voltage.

10 Claims, 5 Drawing Sheets

FREQUENCY JITTER GENERATION CIRCUIT

BACKGROUND OF THE INVENTION

1. Field of the Invention

The present invention is related to a frequency generation circuit, and more particular to a frequency jitter generation circuit.

2. Description of Related Art

The handling of noise and electromagnetic interference (EMI) are unavoidable challenges in high speed circuit design. EMI is the disturbance due to electromagnetic radiation emitted from an operating electronic device, which affects other electronic devices. Due to ever increasing operating frequency of modern electronic devices, the phenomenon of EMI becomes more severe. In practice, as EMI peak value exceeds the regulation defined by United State Federal Communication Committee (FCC), other electronic devices might be interfered by the overly-strong electromagnetic radiation to affect the operation and performance of the electronic devices.

Currently, most of the electronic devices generate operating frequency signals by using an oscillator circuit. Please refer to FIG. 1, which is a circuit diagram showing a frequency generation circuit (i.e. the oscillator circuit) of the prior art. As shown, the oscillator circuit 1 generates a frequency signal f based on an upper reference voltage $V_H$ and a lower reference voltage $V_L$. The oscillator circuit 1 includes a comparator 11, a capacitor C, a first current source i1, and a second current source i2. The capacitor C is coupled to the inverting input terminal of the comparator 11. The non-inverting input terminal of the comparator 11 is coupled to a voltage source of the upper reference voltage $V_H$ and a voltage source of the lower reference voltage $V_L$. The upper reference voltage $V_H$ and the lower reference voltage $V_L$ are used as comparison value for charging and discharging the capacitor C, respectively. The first current source i1 is coupled to the capacitor C for charging the capacitor C, and the second current source i2 is coupled between the capacitor C and a ground node for discharging the capacitor C.

At first, the frequency signal f is at high level and a control signal o1 is generated to turn on the switches q1 and q3 simultaneously, which causes the oscillator circuit 1 entering the charging mode. At this time, the comparator 11 adopts the upper reference voltage $V_H$, which is input to the non-inverting input terminal, as the comparison value. Then, the first current source i1 begins to charge the capacitor C. When the voltage level stored in the capacitor C exceeds the upper reference voltage $V_H$, the comparator 11 reverses the frequency signal f so as to generate a control signal o2 to turn on the switches q2 and q4 and to generate the control signal o1 to turn off the switches q1 and q3. As the switches q2 and q4 being conducted in addition to the switches q1 and q3 being turned off, the comparator 11 adopts the lower reference voltage $V_L$, which is input to the non-inverting input terminal, as the comparison value so as to cause the oscillator circuit 1 entering the discharge mode. Meanwhile, the second current source i2 establishes a current path to discharge the capacitor C. Then, when the voltage level stored in the capacitor C falls below the lower reference voltage $V_L$, the comparator 11 reverses the frequency signal f to turn on the switches q1 and q3 and turn off the switches of q2 and q4 once more and thus complete a cycle. The above mentioned charging and discharging operation of the capacitor C are repeated. In addition, the voltage level stored in the capacitor C is restricted to oscillate between the upper reference voltage $V_H$ and the lower reference voltage $V_L$ by the above mentioned mechanism.

However, in the above mentioned oscillator circuit 1, because the upper reference voltage $V_H$ and the lower reference voltage $V_L$ are constant, charging and discharging periods of the capacitor C are fixed. As shown in FIG. 2A, once the voltage level of the capacitor C reaches the upper reference voltage $V_H$, the capacitor C begins to discharge, and once the discharging of the capacitor C led to a voltage level lower than the lower reference voltage $V_L$, the capacitor C begins to be charged. As every discharging and charging periods are kept the same, the frequency of the frequency signal f is thus fixed. As shown in FIG. 2B, the time of high level t1 and the time of low level t2 on the wave of the frequency signal f are fixed, and thus waveform of the frequency signal f on the frequency spectrum is concentrated. As shown in FIG. 2C, the frequency signal f is concentrated to a constant main frequency m. Thus, the electronic device with the frequency generating circuit mentioned above may radiate electromagnetic wave having most of the power lies at the main frequency thereby result in EMI problems.

SUMMARY OF THE INVENTION

Accordingly, the present invention proposes a control circuit integrated to the typical oscillator circuit in order to change the comparison value of the oscillator circuit. The control circuit jitters the voltage level within the oscillator circuit to generate the effect of frequency jitter so as to disperse the frequency spectrum of the frequency signal to reduce the EMI problem.

It is an object of the present invention to provide a frequency jitter generation circuit for suppressing and dispersing the power corresponding to the main frequency of the electromagnetic wave generated by the oscillator circuit.

Another object of the present invention is to provide a frequency jitter generation circuit for moderating the phenomenon of EMI.

Thus the present invention discloses a frequency jitter generation circuit having a voltage generator, an oscillator circuit, and a frequency divider circuit. The voltage generator is utilized for receiving an input voltage and converting the input voltage into a varying limitation voltage output to the oscillator circuit. The oscillator circuit is coupled to the voltage generator. A reference voltage of the oscillator circuit is oscillated between voltage level of an upper reference voltage and a lower reference voltage so as to generate a frequency signal. The frequency divider circuit is coupled to the oscillator circuit for processing frequency dividing according to the frequency signal to generate a first control signal and a second control signal, wherein the second control signal is an inverted signal with respect to the first control signal.

The oscillator circuit has a first capacitor. When the frequency signal is at high level, the first capacitor enters the charging mode. When the frequency signal is at low level, the first capacitor enters the discharge mode. When the voltage level stored in the first capacitor voltage exceeds the upper reference voltage, or the voltage level stored in the first capacitor voltage falls below the lower reference voltage, the frequency signal would be reversed (i.e. high to low or low to high).

The voltage generator has a second capacitor. When the first control signal is at high level, the input voltage charges the second capacitor. When the second control signal is at high level, the second capacitor enters the discharge mode. Thereby, the voltage level stored in the second capacitor voltage is varied. The voltage level provided by the second capacitor is received by the oscillator circuit as the upper reference voltage or the lower reference voltage.

In the present invention, the upper reference voltage may increase gradually, decrease gradually, or be under a condition of a combination of increasing and decreasing gradually. For example, the upper reference voltage may be alternatively increased and decreased. The frequency of the frequency signal may vary from low to high, from high to low, or in both ways.

According to the technical mentioned supra, the present invention is capable to control the frequency signal varying in a predetermined range (i.e. deterministic jitter) to disperse the power corresponding to a specific frequency (i.e. main frequency) of the generated electromagnetic wave so as to suppress the EMI peak value of the specific frequency to solve the EMI problem.

In addition to the general description above, preferred embodiments together with related drawings are provided for illustrating the method, technical measure, and performance of the present invention that achieve the expected objectives, and other objectives and advantages of the present invention will be described as follows. However the drawings are only provided for reference and description, and are not meant to limit the present invention.

DETAILED DESCRIPTION OF THE PREFERRED EMBODIMENTS

The frequency jitter generation circuit proposed in the present invention integrates a control circuit to a typical regular oscillator circuit for adjusting the reference voltage in the oscillator circuit so as to change charging and discharging time of the oscillator circuit, which may cause the frequency of the generated frequency signal to disperse from the main frequency. The power of the electromagnetic wave corresponding to the specific frequency can be suppressed to solve the EMI problem.

The present invention features a control circuit integrated to a frequency generator to jitter the voltage level of the reference voltage, which is utilized to generate the frequency signal. The structure mentioned below depicts the necessary components and the operation process thereof. However, those skilled in the art would know that a frequency generator may include other components and formula except the structure mention below. Thus, the present invention should not be limited to the scope of the disclosed embodiments.

Figure 3:
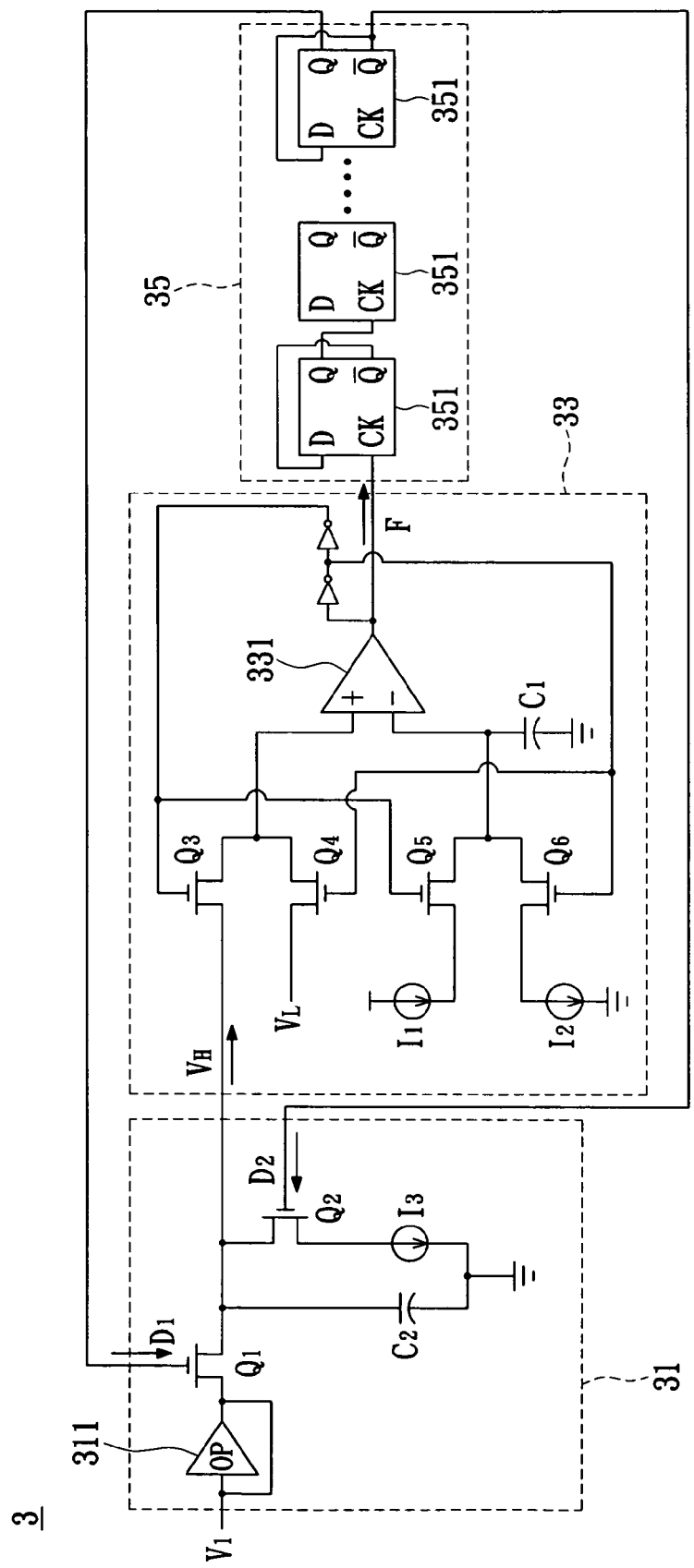
FIG. 3 is a circuit diagram showing a frequency jitter generation circuit according to an embodiment of the present invention.

FIG. 3 shows a frequency jitter generation circuit according to an embodiment of the present invention. As shown, the frequency jitter generation circuit 3 includes a voltage generator 31, an oscillator circuit 33, and a frequency divider circuit 35. The voltage generator 31 is utilized for receiving an input voltage V1 and converting the input voltage V1 into an upper reference voltage $V_H$ output to the oscillator circuit 33. In practice, the input voltage V1 may be a fixed direct current voltage. The lower reference voltage $V_L$ can be generated by a typical reference voltage generator, which outputs a constant reference voltage, or generated by a voltage generator similar to the voltage generator 31 for generating the high reference voltage $V_H$. The oscillator circuit 33 is coupled to the voltage generator 31 for receiving the upper reference voltage $V_H$ and the lower reference voltage $V_L$ to generate a frequency signal F accordingly. The frequency divider circuit 35 is coupled to the oscillator circuit 33 and is used to generate a first control signal D1 and a second control signal D2 according to the frequency signal F.

The previously mentioned oscillator circuit 33 includes a comparator 331, a first capacitor C1, a first current source I1, and a second current source I2. The comparator 331 includes a non-inverting input terminal, an inverting input terminal, and an output terminal, wherein the non-inverting input terminal is coupled to a voltage source generating the upper reference voltage $V_H$ and another voltage source generating the lower reference voltage $V_L$, and the output terminal outputs the frequency signal F. The first capacitor C1 is coupled to the inverting input terminal of the comparator 331, the first current source I1 is coupled to the first capacitor C1, and the second current source I2 is coupled between the first capacitor C1 and a ground node.

In the beginning, the frequency signal F is at high level, the switches Q3 and Q5 are turned on simultaneously to have the oscillator circuit 33 enter the charging mode. At this time, the upper reference voltage $V_H$ input to the non-inverting input terminal of the comparator 331 would be used as the comparison value. Then, the first current source I1 begins to charge the first capacitor C1. When voltage level of the first capacitor C1 exceeds the upper reference voltage $V_H$, the comparator 331 reverses the frequency signal F so as to turn on the switches Q4 and Q6 and turn off the switches Q3 and Q5. As the switches Q4 and Q6 are turned on, the lower reference voltage $V_L$ input to the non-inverting input terminal of the comparator 331 would be used as the comparison value to have the oscillator circuit 33 entering the discharge mode. Meanwhile, the second current source I2 establishes a current path to discharge the first capacitor C1. Then, when the voltage level of the first capacitor C1 voltage falls below the lower reference voltage $V_L$, the comparator 331 reverses the frequency signal F so as to turn on the switches of Q3 and Q5 and turn off the switches Q4 and Q6, and thus complete a cycle. The aforementioned charging and discharging operation of the first capacitor C1 is repeated so as to continuously generate the frequency signal F to the frequency divider circuit 35.

The frequency divider circuit 35 is composed of a plurality of flip-flops 351 coupled serially. After the frequency signal F has been processed by the frequency divider circuit 35, a first control signal D1 and a second control signal D2 are generated as feedback to the voltage generator 31 to control the variation of the upper reference voltage $V_H$. The second control signal D2 is an inverted signal with respective to the first control signal D1. In one embodiment of the present invention, the above mentioned flip-flop 351 is chosen from a group consisting of D-type flip-flop, SR-type flip-flop, and JK-type flip-flop.

The voltage generator 31 includes an amplifier 311, a second capacitor C2, and a third current source I3. The amplifier 311 is coupled to the second capacitor C2. The second capacitor C2 is coupled to the oscillator circuit 33 so as to provide the upper reference voltage $V_H$ to the oscillator circuit 33. The third current source I3 is coupled to the second capacitor C2 for discharging the second capacitor C2. When the first control signal D1 is at high level to turn on the switch Q1, the input voltage V1 would rapidly charge the second capacitor C2 through the amplifier 311 so as to increase the voltage level of the upper reference voltage $V_H$ to the voltage level of the input voltage V1. Then, when the first control signal D1 is at low level and the second control signal D2 is at high level, the switch Q1 is turned off and the switch Q2 is turned on, Meanwhile, the third current source I3 establishes a current path to discharge the second capacitor C2 so as to decrease the voltage level of the upper reference voltage $V_H$ gradually until the first control signal D1 returns to the high level to complete a cycle. The variation of the upper reference voltage $V_H$ influences the comparison value of the comparator 331 in the oscillator circuit 33. As the voltage level of the upper reference voltage $V_H$ reduced gradually, charging and discharging time of the first capacitor C1 are varied to enhance the frequency of the frequency signal F.

Figure 4:
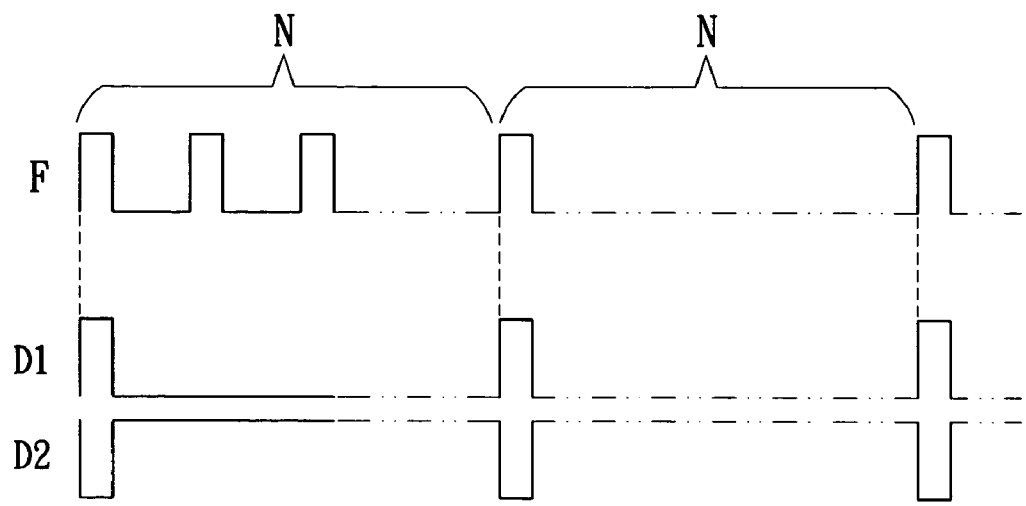
FIG. 4 is a timing diagram depicting the first control signal, the second control signal, and the frequency signal generated by the frequency jitter generation circuit in accordance with the present invention.

For a better understanding of the timing of the frequency signal F and the control signals generated by the frequency divider 35, please refer to FIG. 3 in conjunction with FIG. 4, wherein FIG. 4 is a timing diagram depicting the first control signal D1, the second control signal D2, and the frequency signal F generated by the frequency jitter generation circuit of the present invention. As shown in FIG. 4, when the first unit of the frequency signal F is at high level, the first control signal D1 is also at high level to turn on the switch Q1. Thereby, voltage level of the upper reference voltage $V_H$ is rapidly increased to match the input voltage V1. Then, as the frequency signal F shifted to low level, the second control signal D2 is at high level to turn on the switch Q2 to discharge the second capacitor C2. Thereby, voltage level of the upper reference voltage $V_H$ is reduced gradually. After a predetermined number (N) of repeating units of the frequency signal passed by, the first control signal D1 is shifted to high level again so that the voltage level of the upper reference voltage $V_H$ is increased to match the voltage level of the input voltage V1 once again. As mentioned above, the repeating period of the upper reference voltage $V_H$ is N times longer than repeating period of the frequency signal F.

Figure 5A:
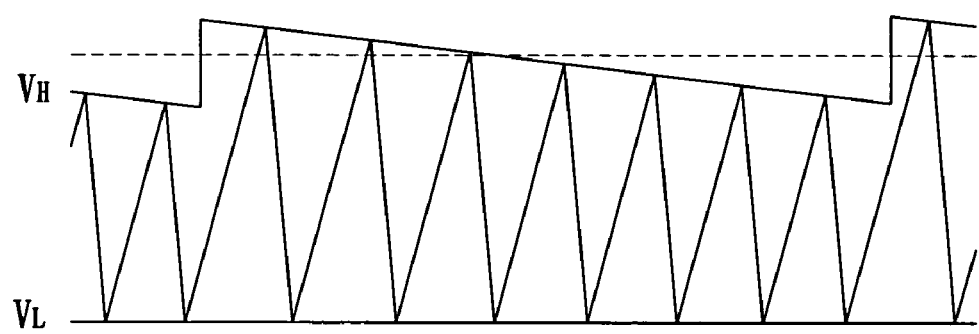
FIG. 5A is a timing diagram showing waveform of the voltage level stored in the first capacitor according to an embodiment of the present invention.
Figure 5B:
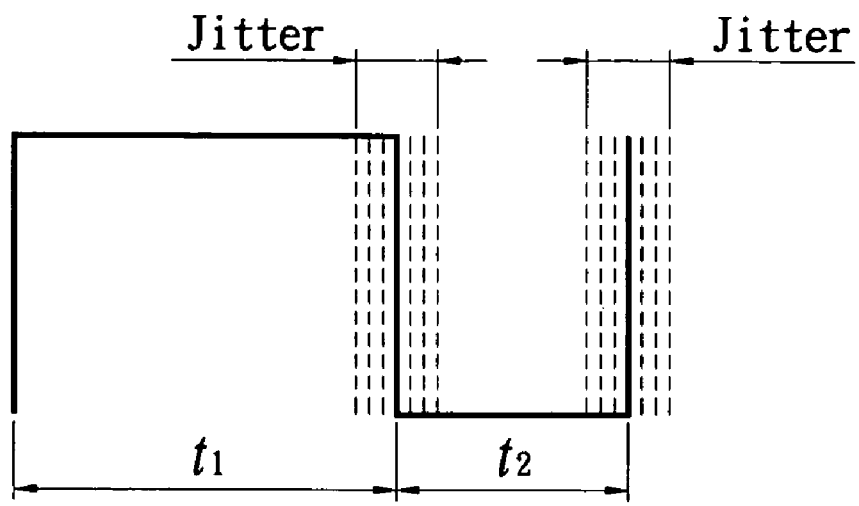
FIG. 5B is a timing diagram showing waveform of the generated frequency signal according to an embodiment of the present invention.
Figure 5C:
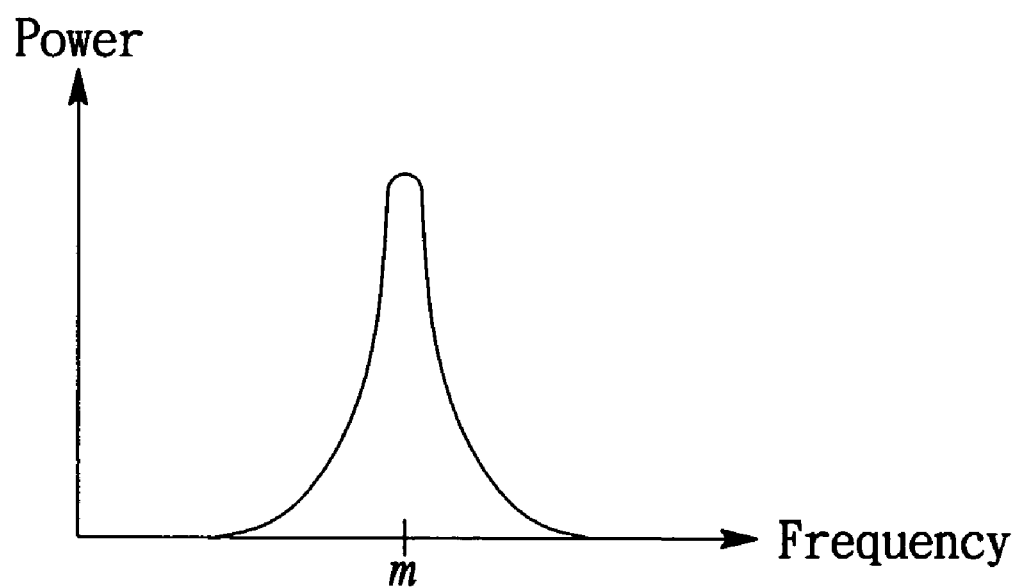
FIG. 5C is a frequency spectrum of the frequency signal generated by the frequency jitter generation circuit according to an embodiment of the present invention.

Finally, please refer to FIG. 3 in conjunction with FIGS. 5A to 5C. As shown in FIG. 5A, as the voltage level of the upper reference voltage $V_H$ is varied from a high voltage level to a low voltage level, the discharging time for the first capacitor C1 in the oscillator circuit 33 returns to the low reference voltage $V_L$ is decreased so as to increase the switching rate of the frequency signal F to cause the frequency signal F to move from low frequency to high frequency.

In order to reduce the frequency error generated by the voltage error of the upper reference voltage $V_H$ (and/or lower reference voltage $V_L$) resulted from the noise, as a preferred embodiment, the voltage level of the upper reference voltage $V_H$ (and/or lower reference voltage $V_L$) should be varied within the range of linear charging and discharging of the first capacitor C1.

Figure 1:
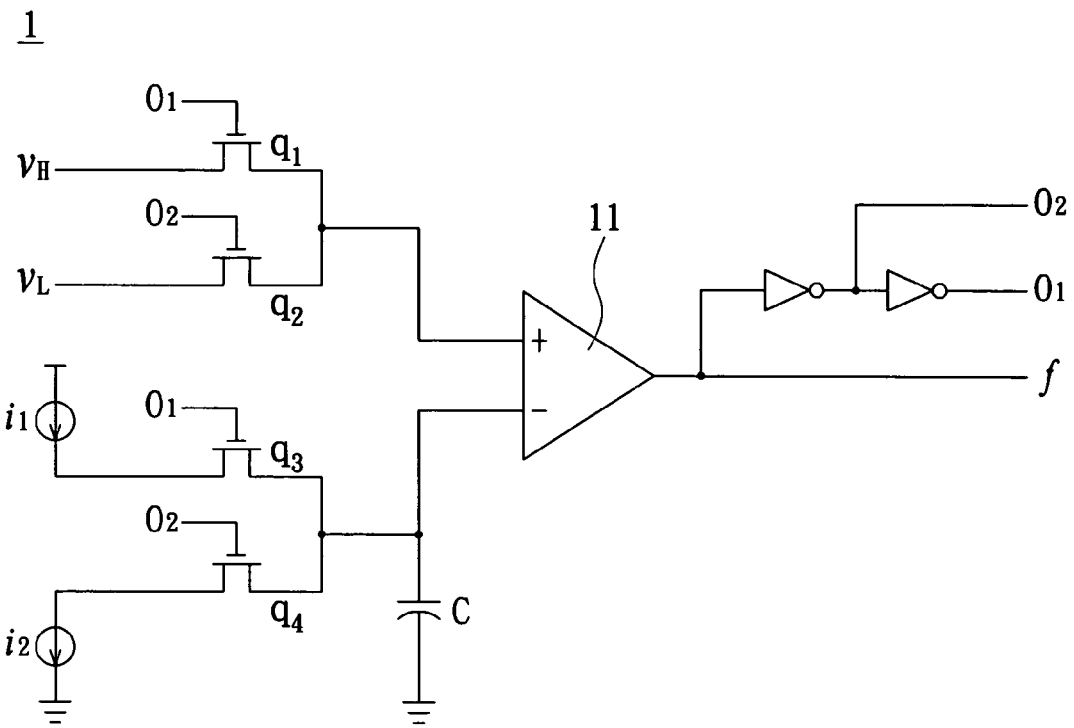
FIG. 1 is a circuit diagram showing a frequency generation circuit of the prior art.
Figure 2A:
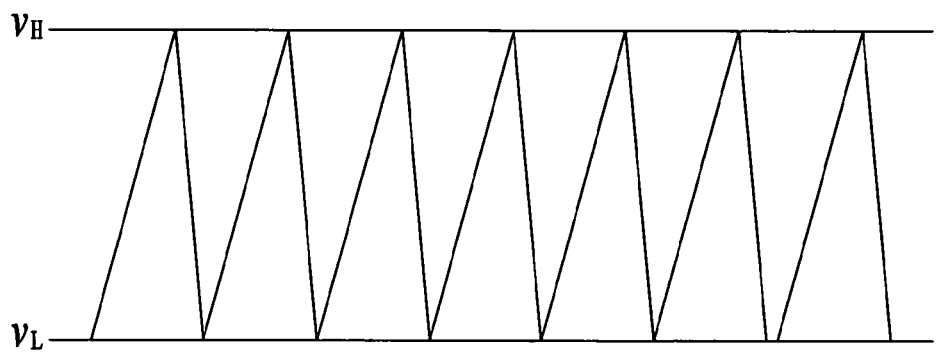
FIG. 2A is a timing diagram showing waveform of the voltage level of the capacitor of the prior art.
Figure 2B:
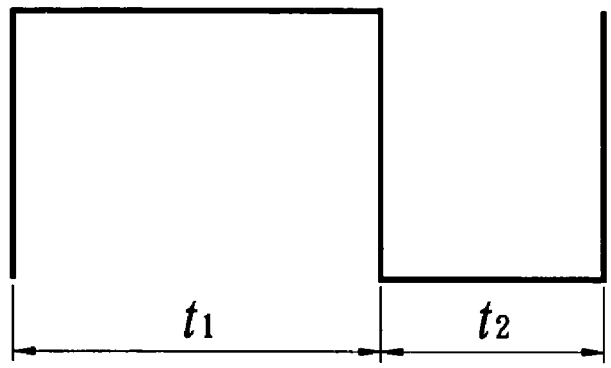
FIG. 2B is a timing diagram showing waveform of the generated frequency signal of the prior art.
Figure 2C:
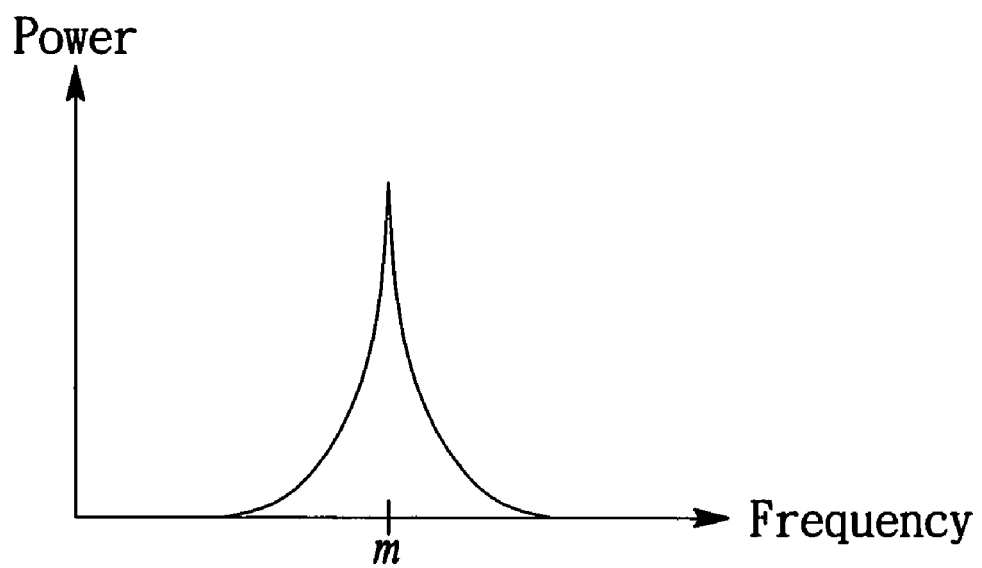
FIG. 2C is a frequency spectrum of the frequency signal generated by the frequency generation circuit of the prior art.

As mentioned, voltage jitter of the upper reference voltage $V_H$ may result in frequency jitter of the frequency signal F. Therefore, referring to FIG. 5B, the time of high level t1 and the time of low level t2 of the frequency signal F would be varied within a small range. In practice, the ratio between the time of high voltage t1 and that of low voltage t2 is also determined by the ratio of current from the first current source I1 and the second current source I2. As mentioned, frequency of the frequency signal F is not constant. In contrast with waveform of the frequency signal f on the frequency spectrum of FIG. 2C, waveform of the frequency signal F on the frequency spectrum is more dispersed as shown by FIG. 5C. Since the frequency signal F is dispersed around the main frequency m (i.e. deterministic frequency jitter), the power of the electromagnetic wave with the main frequency can be suppressed to prevent the EMI problem.

In the embodiment of the present invention mentioned above, there is a gradual decrease in voltage level of the upper reference voltage $V_H$. However, there may be a gradual increase or a combination of gradual increase and gradual decrease in the voltage level of the upper reference voltage $V_H$ by changing the design of the voltage generator 31. Therefore, the frequency of the frequency signal F may be changed from low to high, from high to low, or in both ways. In practice, referring to FIG. 3, the upper reference voltage $V_H$ may be increased gradually by rearranging the third current source 13 to charge the second capacitor C2. In addition, the upper reference voltage $V_H$ may be increased and decreased alternatively by charging and discharging the second capacitor C2 alternatively. Furthermore, in addition to producing jitter on the upper reference voltage $V_H$ to adjust the frequency of the frequency signal F, it is possible to cooperatively produce jitter on the lower reference voltage $V_L$. Thus, the present embodiment is not meant to be a limitation to the present invention.

As described above, it is understood that the frequency jitter generation circuit of the present invention adjusts at least one of the upper reference voltage and the lower reference voltage, which are used as the internal reference voltage of the oscillator circuit, so as to change the charging and discharging time to results in frequency jitter. Thus, EMI peak value corresponding to the main frequency can be reduced and the power corresponding to the specific frequency can be dispersed to prevent the EMI problem.

While the present invention has been described in terms of what is presently considered to be the most practical and preferred embodiments, it is to be understood that the present invention is not limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A frequency jitter generation circuit, comprising:
    a voltage generator, for receiving an input voltage and converting the input voltage into a varying limitation voltage;
    an oscillator circuit, coupled to the voltage generator, for outputting a reference voltage of the oscillator circuit being oscillated between an upper reference voltage and a lower reference voltage to generate a frequency signal; and
    a frequency divider circuit, coupled to the oscillator circuit and the voltage generator, for performing a frequency dividing according to the frequency signal in order to generate a first control signal and a second control signal for controlling a variation of the limitation voltage;

wherein the second control signal is an inverted signal with respect to the first control signal, and the limitation voltage is received by the oscillator circuit as the upper reference voltage or the lower reference voltage.

2. The frequency jitter generation circuit as claimed in claim 1, wherein the frequency divider circuit comprises a flip-flop, which is selected from a group composed of D-type flip-flops, SR-type flip-flops, and JK-type flip-flops.

3. The frequency jitter generation circuit as claimed in claim 1, wherein the frequency divider circuit comprises a plurality of flip-flops coupled serially, and the flip-flops are selected from a group composed of D-type flip-flops, SR-type flip-flops, and JK-type flip-flops.

4. The frequency jitter generation circuit as claimed in claim 1, wherein the oscillator circuit comprises:
  a comparator, having a non-inverting input terminal, an inverting input terminal, and an output terminal, wherein the non-inverting input terminal is coupled to a voltage source generating the upper reference voltage and another voltage source generating the lower reference voltage, and the output terminal outputs the frequency signal;
  a first capacitor, coupled to the inverting input terminal of the comparator;
  a first current source, coupled to the first capacitor, for charging the first capacitor when the frequency signal is at a high level; and
  a second current source, coupled between the second capacitor and a ground node, for discharging the first capacitor when the frequency signal is at a low level;
  wherein a voltage level of the first capacitor is the reference voltage, and when the reference voltage exceeds the upper reference voltage, or when the reference voltage falls below the lower reference voltage, the frequency signal is reversed.

5. The frequency jitter generation circuit as claimed in claim 1, wherein the voltage generator comprises:
  an amplifier, coupled to the oscillator circuit and receiving the input voltage;
  a second capacitor, coupled between an output terminal of the amplifier and a ground node, a voltage level of the second capacitor being output as the limitation voltage; and
  a third current source, coupled to the second capacitor;
  wherein, when the first control signal is at a high level, the input voltage charges the second capacitor through the amplifier, and when the second control signal is at a high level, the third current source discharges the second capacitor to change the voltage level of the second capacitor.

6. The frequency jitter generation circuit as claimed in claim 1, wherein a voltage level of the limitation voltage increases gradually, decreases gradually, or alternatively increases and decreases gradually.

7. The frequency jitter generation circuit as claimed in claim 6, wherein a frequency of the frequency signal changes from high to low, from low to high, or in both ways.

8. The frequency jitter generation circuit as claimed in claim 4, wherein a current ratio of the first current source to the second current source determines a time ratio of the high level and the low level of the frequency signal.

9. The frequency jitter generation circuit as claimed in claim 1, wherein the input voltage is a constant direct current voltage.

10. The frequency jitter generation circuit as claimed in claim 1, wherein the lower reference voltage is variable.

* * * * *